(12) United States Patent
Miles et al.

(10) Patent No.: US 10,768,213 B2
(45) Date of Patent: Sep. 8, 2020

(54) SOFTWARE-DEFINED RADIOMETER

(71) Applicant: United States of America as represented by the Administrator of NASA, Washington, DC (US)

(72) Inventors: Lynn R. Miles, District Heights, MD (US); Damon C. Bradley, Laurel, MD (US); Englin Wong, Hanover, MD (US); Alicia T. Joseph, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 471 days.

(21) Appl. No.: 15/690,852

(22) Filed: Aug. 30, 2017

(65) Prior Publication Data

US 2019/0064235 A1 Feb. 28, 2019

(51) Int. Cl.
*G01R 23/165* (2006.01)
*G01R 23/16* (2006.01)
(Continued)

(52) U.S. Cl.
CPC .......... *G01R 23/165* (2013.01); *G01R 23/06* (2013.01); *G01R 23/16* (2013.01); *G01R 29/08* (2013.01); *G01R 29/0878* (2013.01)

(58) Field of Classification Search
CPC .... G01R 29/08; G01R 29/0878; G01R 23/16; G01R 23/06; G01R 23/165
See application file for complete search history.

(56) References Cited

U.S. PATENT DOCUMENTS

| 4,198,596 A * | 4/1980 | Waeselynck | G01V 3/12 324/335 |
| 6,529,158 B2 * | 3/2003 | Martin-Neira | G01S 3/46 342/351 |
| 10,416,213 B2 * | 9/2019 | Pathak | G01R 29/08 |

OTHER PUBLICATIONS

Peng, J., and C. S. Ruf (2010), Effects of clock frequency stability on digital microwave radiometer performance, Radio Sci., 45, RS4005, doi:10.1029/2009RS004272. (Year: 2010).*

* cited by examiner

*Primary Examiner* — Cassi J Galt
(74) *Attorney, Agent, or Firm* — Christopher O. Edwards; Bryan A. Geurts; Helen M. Galus

(57) ABSTRACT

A software-defined radiometer includes dual RF front end channels. One RF front end channel processes the horizontal polarization signals and the other RF front end channel processes the vertical polarization signals. Each RF front end channel includes a power splitter for splitting the polarization signals into a plurality of identical polarization signals, a filter bank of N-bandpass filters that have the same bandwidth but different center frequencies and a multi-input switch. The bandpass filters filter the horizontal and vertical polarization signals and provide a plurality of filtered horizontal and vertical polarization signals. A control circuit issues a control signal to the multi-input switch so as to route a desired one of the plurality of filtered horizontal and vertical polarization signals to a programmable frequency converter. The programmable frequency converter includes a programmable local oscillator that is configured to generate signals having any one of N frequencies and is used to produce intermediate frequency representations of the horizontal and vertical polarization signals. The intermediate frequency representations are converted into digital signals and processed to extract desired information and data.

41 Claims, 1 Drawing Sheet

(51) Int. Cl.
*G01R 23/06* (2006.01)
*G01R 29/08* (2006.01)

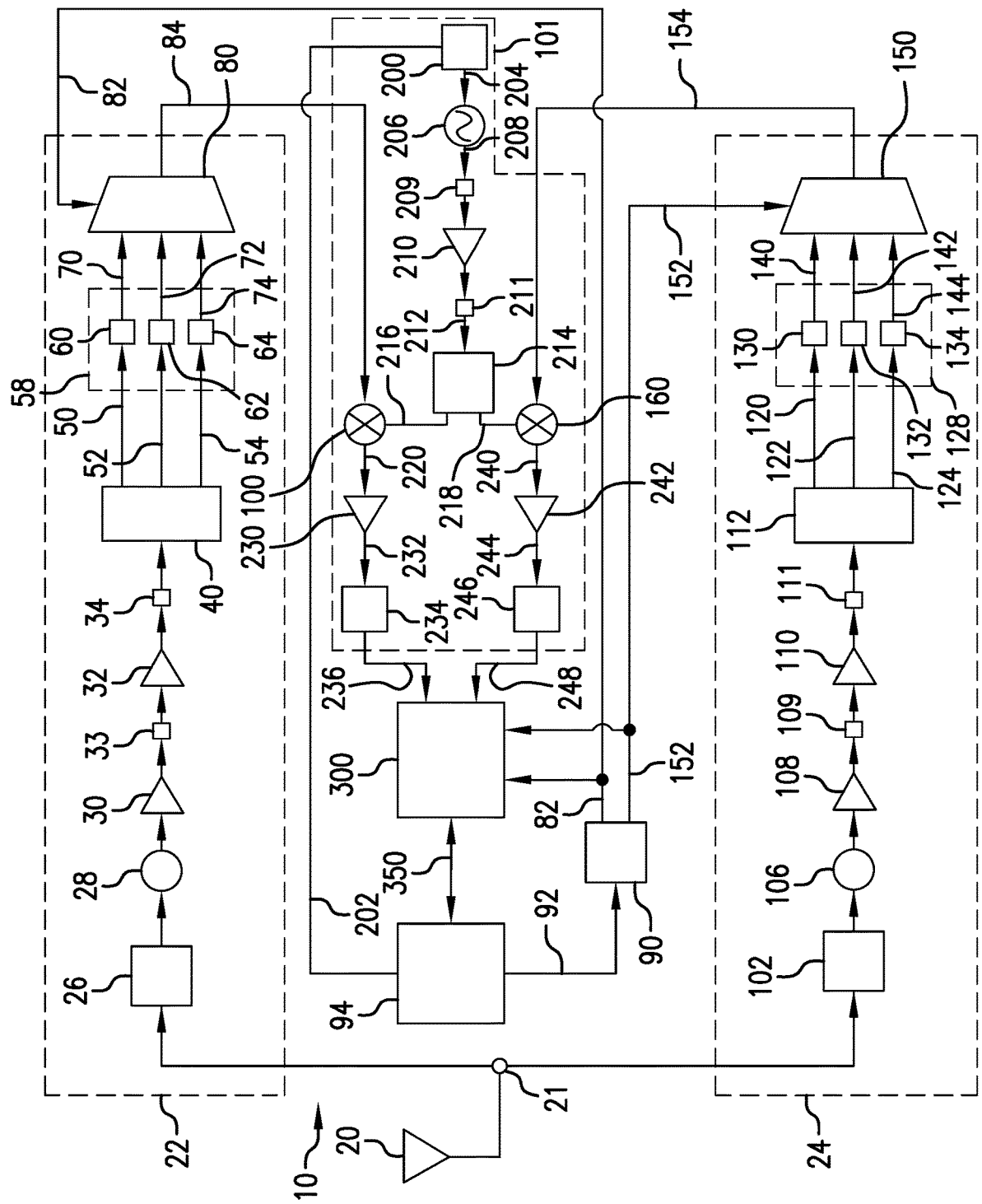

SOFTWARE-DEFINED RADIOMETER

ORIGIN OF INVENTION

The invention described herein was made by an employee of the United States Government, and may be manufactured and used by or for the Government for governmental purposes without the payment of any royalties thereon or therefor.

CROSS REFERENCE TO OTHER PATENT APPLICATIONS

None.

FIELD OF THE INVENTION

The present invention relates to a radiometer.

BACKGROUND

Microwave radiometers are used to obtain information on environmental data, changes in the Earth's surface and atmosphere, weather forecasting and responding to human welfare issues, e.g. disease outbreaks, food shortage and floods. For example, microwave radiometers obtain data that can be used to measure soil moisture and freeze-thaw state for weather and water cycle processes. In another example, microwave radiometers can measure ice sheet internal temperatures at depth and snow thickness. Microwave radiometers can also obtain data on the Earth's geological structures, thermal anomalies, geomorphologic features and the distribution of vegetation. All of these factors are important in the understanding of a region, its environment and its resources. In many instances, it is necessary to obtain and analyze environmental information and data for an entire frequency band instead of a subset of the frequency band. Such environmental information and data includes RFI mitigation, ground validation, RFI surveying and RH research. In order to allow analysis of such environmental information and data for an entire frequency band, conventional practices entailed the design and construction of multiple RF front end channels for use in the radiometer, wherein each RF front end channel is dedicated to the processing a particular portion of the frequency band of interest. However, such a practice is expensive due to the significant time and expense required for the additional design, testing, calibration and construction of the additional RF front end channels.

What is needed is a radiometer that eliminates the problems and disadvantages associated with the aforementioned conventional practices.

SUMMARY OF THE INVENTION

The software-defined radiometer of the present invention is capable of scanning multiple radio frequency bands (e.g. L-K band, up to 200 MHz bandwidth) using the same receiver architecture thereby allowing environmental information and data to be analyzed for an entire frequency band without interchanging RF front end channels in order to cover particular subsets of the frequency band of interest. Thus, the architecture of the radiometer of the present invention eliminates the need for designing multiple radiometer front ends and the corresponding costs.

One exemplary embodiment of the invention sets forth a radiometer for receiving and processing RF signals of the same frequency but with different polarizations comprising a plurality of RF signal paths wherein each RF signal path is configured to receive and process RF signals having a particular polarization. The radiometer includes an input bandpass filter in each RF signal path for filtering the received RF signal having the particular polarization and outputting a filtered received RF signal. The input bandpass filter of each RF signal path has the same predetermined bandwidth and center frequency. A signal splitting device in each RF signal path splits the filtered received RF signal into a plurality of identical RF signals. The radiometer includes a filter bank of bandpass filters in each RF signal path wherein each bandpass filter of the filter bank has substantially the same bandwidth but different center frequencies and wherein each of the identical RF signals is filtered by a corresponding bandpass filter of the filter bank so as to provide a plurality of uniquely filtered RF signals having the particular polarization. The radiometer includes an electronically controlled switch in each RF signal path which includes a plurality of RF signal inputs, a RF signal output and a control signal input for receiving a control signal that determines which of the RF signal inputs is to be coupled to the RF signal output. Each RF signal input of the electronically controlled switch receives a corresponding uniquely filtered RF signal provided by the filter bank. The electronically controlled switch couples one of the uniquely filtered RF signals to the RF signal output upon receiving the control signal. The radiometer further includes programmable frequency conversion circuitry for converting the uniquely filtered RF signals outputted by the electronically controlled switch of each RF signal path into intermediate frequency representations having predetermined intermediate frequencies. The radiometer includes signal conversion circuitry for converting the intermediate frequency representations into digital signals and a signal processor to process the digital signals to extract desired information from the digital signals.

Another exemplary embodiment of the invention sets forth a software-defined radiometer including an antenna configured to receive horizontal polarization RF signals and vertical polarization RF signals and a pair of RF front end channels. One RF front end channel processes horizontal polarization signals and the other RF front end channel processes vertical polarization signals. Each RF front end channel includes an input bandpass filter having an input coupled to the antenna for receiving the polarization signals, an output, a predetermined bandwidth and a predetermined center frequency. The input bandpass filter outputs a filtered polarization signal. Each RF front end channel further includes at least one amplifier for amplifying the filtered polarization signal to produce an amplified polarization signal, a power splitter for splitting the amplified polarization signal into a plurality of identical polarization signals and a filter bank comprising a plurality of bandpass filters. Each bandpass filter of the filter bank has the same bandwidth but a different center frequency. Each bandpass filter in the filter bank filters a corresponding one of the plurality of identical polarization signals outputted by the power splitter and outputs a filtered polarization signal. Each RF front end channel further comprises an analog switch having a plurality of inputs. Each input of the analog switch receives a corresponding one of the plurality of filtered polarization signals outputted by the filter bank. The analog switch includes an output and a selection signal input for receiving a selection signal that configures the analog switch to couple a particular one of the plurality of filtered polarization signals outputted by the filter bank to the output of the analog switch. The radiometer further includes a programmable control circuit for providing the selection signals and a programmable frequency converter that includes one or more programmable hardware elements that cooperate to convert the selected filtered polarization signals outputted by the analog switches to intermediate frequency representations. The intermediate frequency representations have predetermined frequencies that are based on the frequencies of the selected filtered polarization signals outputted by the analog switches. The radiometer further includes a computer for generating a first control signal that causes the programmable control circuit to generate selection signals for input into the analog switches to enable each analog switch to output filtered polarization signals with desired center frequencies. The computer also generates a second control signal for input into the programmable frequency converter to enable generation of the intermediate frequency representations of the filtered horizontal polarization signals and the vertical polarization signals outputted by the analog switches. The second control signal determines the frequencies of the intermediate frequency representations. The radiometer further includes a processing element for converting the intermediate frequency representations into digital signals.

In an exemplary embodiment, the software-defined radiometer observes 85 MHz of bandwidth by sweeping three 26 MHz bands of interest.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

FIG. 1 is a block diagram of the software-defined radiometer in accordance with an exemplary embodiment of the present invention.

DETAILED DESCRIPTION OF EXEMPLARY EMBODIMENTS

As used herein, the term "memory medium" includes any of various types of memory devices or storage devices, such an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers or other similar types of memory elements, etc. The memory medium may include other types of memory as well or combinations thereof. In addition, the memory medium may be located in a first computer system in which the programs are executed, or may be located in a second different computer system which connects to the first computer system over a network, such as the Internet. In the latter scenario, the second computer system may provide program instructions to the first computer for execution. The term "memory medium" may include two or more memory mediums which may reside in different locations, e.g. in different computer systems that are connected over a network. The memory medium may store program instructions (e.g., embodied as computer programs) that may be executed by one or more processors.

As used herein, "Programmable Hardware Element" includes various hardware devices comprising multiple programmable function blocks connected via a programmable interconnect. Examples include Arduino boards, programmable control circuits or boards, FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look-up tables) to coarse grained (arithmetic logic units or processor cores). Other examples of "Programmable Hardware Elements" include programmable power supplies, programmable voltage sources and programmable voltage controlled oscillators (VCXO).

As used herein, "Processing Element" refers to various elements or combinations of elements. Processing elements include, for example, circuits such as an ASIC (Application Specific Integrated Circuit), portions or circuits of individual processor cores, entire processor cores, individual processors, signal processors having analog-to-digital conversion circuitry, programmable hardware devices such as field programmable gate array (FPGA), and or larger portions of systems that include multiple processors.

As used herein, "Computer System" refers to any of various types of computing or processing systems, including a personal computer system (PC), mainframe computer system, workstation, network appliance, Internet appliance, personal digital assistant (PDA), personal communication device, smart phone, television system, grid computing system, or other device or combinations of devices, or any device (or combination of devices) having at least one "processing element" that executes instructions from a memory medium.

Referring to FIG. 1, there is shown an exemplary embodiment of the software-defined radiometer 10 of the present invention. Antenna 20 receives horizontal and vertical polarization radio frequency (RF) signals. Antenna 20 is coupled to input 21 of radiometer 10. In an exemplary embodiment, antenna 20 is configured as a dipole antenna. In an exemplary embodiment, radiometer 10 includes two RF signal front end channels 22 and 24 for processing the horizontal polarization signals and the vertical polarization signals, respectively. Front end channels 22 and 24 have identical configurations and components. Front end channel 22 includes bandpass filter 26 which has an input coupled to input 21 so as to receive the polarization signals from antenna 20. In an exemplary embodiment, bandpass filter 26 filters the L-Band noise signal with an 85 MHz bandwidth and a center frequency of 1413.5 MHz. Thus, the passband of bandpass filter 26 is defined by lower frequency $F_L$=1371 MHz and upper frequency $F_H$=1456 MHz. The output of bandpass filter 26 is coupled to circulator 28. Circulator 28 functions as an isolator so the polarization signals travel only in one direction. Amplifier 30 amplifies the polarization signals outputted by circulator 28. In an exemplary embodiment, amplifier 30 is a low-noise amplifier and has a gain of about 38 dB. In an exemplary embodiment, front end channel 22 further includes amplifier 32. In such an embodiment, amplifiers 30 and 32 are arranged in cascade. Amplifier 32 is also a low-noise amplifier and has a gain of about 30 dB. In an exemplary embodiment, an attenuator 33 is coupled between the output of amplifier 30 and the input to amplifier 32. Attenuator 33 lowers the signal power level of the signal before it is input into amplifier 32. In an exemplary embodiment, attenuator 33 lowers the signal power level by about 2 dB. In another exemplary embodiment, another attenuator 34 is coupled between the output of amplifier 32 and the input of power splitter 40. In an exemplary embodiment, attenuator 34 lowers the signal power level by about 2 dB. Power splitter 40 splits the amplified polarization signal into three identical signals 50, 52 and 54. Each channel of power splitter 40 causes a 6 dB loss in signal strength. However, the amplification of the polarization signals by amplifiers 30 and 32 prior to power splitter 40 compensates for the 6 dB loss in signal amplitude.

Signals 50, 52 and 54 are inputted into filter bank 58. Filter bank 58 includes bandpass filters 60, 62 and 64. Signals 50, 52 and 54 are inputted into bandpass filters 60, 62 and 64, respectively. In an exemplary embodiment, bandpass filter 60 has a 26 MHz bandwidth with a center frequency of 1386.5 MHz. In an exemplary embodiment, bandpass filter 62 has a 26 MHz bandwidth with a center frequency of 1413.5 MHz, which is the same as the center frequency of input bandpass filter 26. In an exemplary embodiment, bandpass filter 64 has a bandwidth of 26 MHz and a center frequency of 1440.5 MHz. Bandpass filters 60, 62 and 64 output filtered signals 70, 72 and 74, respectively. Filtered signals 70, 72 and 74 are inputted into analog switch 80. Analog switch 80 has an input for receiving a selection signal 82 that causes analog switch 80 to couple one of the filtered polarization signals 70, 72 and 74 to the output of analog switch 80. Thus, output signal 84 of analog switch 80 can be filtered signal 70, 72 or 74 depending upon the selection signal 82. In an exemplary embodiment, selection signal 82 is a multi-bit digital signal and analog switch 80 has an input for receiving the multi-bit digital selection signal 82. Selection signal 82 is provided by programmable control circuit 90. In an exemplary embodiment, programmable control circuit 90 comprises a microcontroller board. In one embodiment, the microcontroller board is manufactured by Arduino. Programmable control circuit 90 is in data signal communication with computer system 94 via a universal serial bus (USB). Computer system 94 issues control signal 92 over the universal serial bus to programmable control circuit 90. Control signal 92 is a multi-bit digital signal which defines which of the inputs of analog switch 80 is to be coupled to the output of analog switch 80. In response, programmable control circuit 90 outputs a selection signal 82 that effects coupling of the desired input of analog switch 80 to the output of analog switch 80 so to allow the desired filtered polarization signal to pass through analog switch 80. Programmable control circuit 90 is also in data signal communication with one or more processing elements 300 via a wired connection with standard I/O header extension. Selection signal 82 is also inputted into one or more processing elements 300. The purpose for this configuration is described in the ensuing description. In an exemplary embodiment, computer system 94 is a laptop computer. Computer system 94 and its function are described in detail in the ensuing description. The output signal 84 of analog switch 80 is inputted into mixer 100 which is part of frequency converter 101. Frequency converter 101 is described in detail in the ensuing description.

RF front end channel 24 is identical to RF front end channel 22 and comprises the same type of components. RF front end channel 24 includes a bandpass filter 102 that has an input coupled to input port 21. Bandpass filter 102 has the same bandwidth and center frequency as bandpass filter 26. Bandpass filter 102 filters the polarization signal and outputs a filtered polarization signal that is coupled into circulator 106. Circulator 106 functions in the same manner as circulator 28. The output of circulator 106 is inputted into amplifier 108. Amplifier 108 is a low-noise amplifier. In an exemplary embodiment, amplifier 108 has a gain of about 38 dB. In an exemplary embodiment, the output of amplifier 108 is coupled into attenuator 109. In an exemplary embodiment, attenuator 109 has the same operational characteristics as attenuator 33 and lowers the signal power level by 2 dB. The output of attenuator 109 is coupled into second amplifier 110. In an exemplary embodiment, amplifier 110 is a low-noise amplifier and has a gain of about 30 dB. The output of amplifier 110 is coupled into attenuator 111. Attenuator 111 has the same operational characteristics as attenuator 34. Thus, attenuator 111 lowers the signal power level by about 2 dB. The output of attenuator 111 is coupled into power splitter 112. Power splitter 112 splits the polarization signal into three identical polarization signals 120, 122 and 124. Each channel of power splitter 112 causes a 6 dB loss in signal strength. However, the amplification of the polarization signals by amplifiers 108 and 110 prior to power splitter 112 compensates for the 6 dB loss in signal amplitude. Identical polarization signals 120, 122 and 124 are inputted into filter bank 128. Filter bank 128 includes bandpass filters 130, 132 and 134. Identical polarization signals 120, 122 and 124 are inputted into bandpass filters 130, 132 and 134, respectively. In an exemplary embodiment, bandpass filter 130 has a 26 MHz bandwidth with a center frequency of 1386.5 MHz. In an exemplary embodiment, bandpass filter 132 has a 26 MHz bandwidth with a center frequency of 1413.5 MHz which is the same as the center frequency of input bandpass filter 102. In an exemplary embodiment, bandpass filter 134 has a bandwidth of 26 MHz and a center frequency of 1440.5 MHz. Bandpass filters 130, 132 and 134 output filtered polarization signals 140, 142 and 144, respectively. Filtered polarization signals 140, 142 and 144 are inputted into analog switch 150. Analog switch 150 has an input for receiving selection signal 152 that causes analog switch 150 to couple one of filtered polarization signals 140, 142 and 144 to the output of analog switch 150. Analog switch 150 outputs the selected polarization signal as signal 154. Thus, signal 154 can be filtered polarization signal 140, 142 or 144 depending upon the selection signal 152. In an exemplary embodiment, selection signal 152 is a multi-bit digital signal and analog switch 150 has a multi-bit digital signal input for receiving selection signal 152. Selection signal 152 is provided by programmable control circuit 90. Programmable control circuit 90 receives control signal 92 from computer system 94 as described in the foregoing description. Control signal 92 is a multi-bit digital signal which defines which of the inputs of analog switch 150 is to be coupled to the output of analog switch 150. In response to control signal 92, programmable control circuit 90 outputs selection signal 152 that effects coupling the desired filtered polarization signal 140, 142 or 144 to the output of analog switch 150. Signal 154 is coupled to the input of mixer 160 which is part of programmable frequency converter 101. Selection signal 152 is also routed to processing element 300. The purpose for also routing signal selection signal 152 to processing element 300 is discussed in the ensuing description.

Radiometer 10 further includes programmable frequency converter 101. Programmable frequency converter 101 generates intermediate frequency representations of the selected filtered horizontal polarization signals 84 and selected filtered vertical polarization signals 154 outputted by analog switches 80 and 150, respectively. Programmable frequency converter 101 includes one or more programmable hardware elements that cooperate to generate a local oscillator RF signal having a predetermined frequency. In an exemplary embodiment, one programmable hardware element is a programmable voltage source 200. Programmable voltage source 200 is in electronic data communication with computer system 94 via a GPIB. The user or operator inputs data into computer system 94 which, in response, outputs multi-bit digital control signal 202 over the GPIB for input into programmable voltage source 200. Programmable voltage source 200 outputs a DC voltage signal 204 having a predetermined magnitude that is determined by the multi-bit digital control signal 202. DC voltage signal 204 is coupled to the input of voltage-controlled oscillator (VCO) 206. VCO 206 outputs an RF local oscillator signal 208 that has a frequency that is determined by the magnitude of DC voltage signal 204. In an exemplary embodiment, programmable frequency converter 101 includes attenuator 209. The output of VCO 206 is coupled to the input of attenuator 209. In one embodiment, attenuator 209 lowers the signal power level by about 3 dB. The output of attenuator 209 is coupled to amplifier 210. In exemplary embodiment, amplifier 210 is a low-noise amplifier and has about 30 dB gain. In an exemplary embodiment, programmable frequency converter 101 includes attenuator 211. The output of amplifier 210 is coupled to the input of attenuator 211. In one embodiment, attenuator 211 is configured to lower the signal power level by about 10 dB. Attenuator 211 outputs a signal 212 that is coupled to the input of power splitter 214. Power splitter 214 which splits signal 212 into two identical signals 216 and 218. Power splitter 214 has about a 3 dB loss in each channel. As a result, the signal power level of each signal 216 and 218 is less than the power level of signal 212. Amplifier 210 compensates for the decrease in signal power caused by power splitter 214. Signal 216 is inputted into mixer 100 and is mixed with signal 84 that is outputted by analog switch 80. Similarly, signal 218 is inputted into mixer 160 and mixed with signal 154 that is outputted by analog switch 150.

Mixer 100 combines signals 84 and 216 to produce signal 220 having a heterodyne at the sum of the frequencies of signals 84 and 216 and a heterodyne at the difference between the frequencies of signals 84 and 216. Signal 220 is coupled to the input of amplifier 230 to produce amplified signal 232. In an exemplary embodiment, amplifier 230 is a low-noise amplifier and has about 20 dB gain. Amplified signal 232 is coupled to the input of bandpass filter 234 which filters out the heterodyne at the sum of the frequencies of signals 84 and 216 and allows only the heterodyne at the difference between the frequencies of signals 84 and 216 to pass through to the output of bandpass filter 234. Thus, bandpass filter 234 outputs signal 236 which has an intermediate frequency equal to the heterodyne at the difference between the frequencies of signals 84 and 216. In an exemplary embodiment, bandpass filter 234 has a 24 MHz bandwidth and a center frequency of 13 MHz. Signal 236 is inputted into a processing element 300. In one embodiment, processing element 300 includes a digital signal processor (DSP). Processing element 300 is described in detail in the ensuing description.

Mixer 160 combines signals 154 and 218 to produce signal 240 having a heterodyne at the sum of the frequencies of signals 154 and 218 and a heterodyne at the difference between the frequencies of signals 154 and 218. Signal 240 is coupled to the input of amplifier 242 which amplifies signal 240 to produce amplified signal 244. In one embodiment, amplifier 242 is a low-noise amplifier and has a gain of about 20 dB. Amplified signal 244 is coupled to the input of bandpass filter 246 which filters out the heterodyne at the sum of the frequencies of signals 154 and 218 and allows only the heterodyne at the difference between the frequencies of signals 154 and 218 to pass through to the output of bandpass filter 246. Thus, bandpass filter 246 outputs signal 248 which has an intermediate frequency equal to the heterodyne at the difference between the frequencies of signals 154 and 218. In an exemplary embodiment, bandpass filter 246 has a 24 MHz bandwidth and a center frequency of 13 MHz. Signal 248 is inputted into the digital signal processor (DSP) of processing element 300.

Thus, the particular frequency of signal 208 generated by VCO 206 is based on which of the filtered signals 70, 72 and 74 is selected by analog switch 80 and/or which of the filtered signals 140, 142 and 144 is selected by analog switch 150. The user or operator uses computer system 94 to issue a control signal 92 over the USB to programmable control circuit 90 to issue selection signal 82 to select a desired one of the filtered signals 70, 72 and 74 and issue selection signal 152 to select a desired one of the filtered signals 140, 142 and 144. The user also uses computer system 94 to issue control signal 202 over the GPIB for input into programmable voltage source 200 to cause the programmable voltage source 200 to output a voltage signal having a particular magnitude that causes VCO 206 to output a local oscillator signal having a desired frequency that is based on the frequency of the selected one of the filtered signals 70, 72 and 74 and the frequency of the selected one of the filtered signals 140, 142 and 144.

Processing element 300 is in digital signal communication with computer system 94. In an exemplary embodiment, a universal serial bus (USB) 350 is used to effect digital signal communication between computer system 94 and processing element 300. Processing element 300 includes one or more memory mediums and analog-to-digital circuitry. Intermediate frequency signals 236 and 248 are inputted into processing element 300. The analog-to-digital circuitry of processing element 300 converts the signals 236 and 248 into digital signals. The digital signals are stored in the one or more memory mediums and are also routed to computer system 94. Computer 94 also includes one or more memory mediums for storing the digital signals. In an exemplary embodiment, processing element 300 is a DSP Development Board, such as the Stratix III FPGA DSP Development Board manufactured by Altera Corporation. In response to programmable control circuit 90 sending duplicate selection signals 82 and 152 to processing element 300, the processing element 300 send status signals to computer system 94 that indicate whether analog switch 80 or analog switch 150 was activated or if both analog switch 80 and analog switch 150 were activated simultaneously. This configuration enables processing element 300 to constantly trace which of the analog switches 80 and 150 are active.

Computer system 94 provides data buffering (VHDL) and implements a variety of digital signal processing algorithms on the digital signals it receives from processing element 300. Such digital signal processing algorithms include MATLAB. MATLAB processes the digitized signals provided by processing element 300, effects communication with programmable voltage source 200 over the GPIB and provides the users of radiometer 10 with desired data and information extracted from the intermediate frequency representations of the horizontal polarization signals and vertical polarization signals originally received by dipole antenna 10.

Although the foregoing description is in terms of each RF front end channel 22 and 24 having a filter bank having three bandpass filters, it is to be understood that each RF front end channel 22 and 24 may be configured so that its filter bank has N bandpass filters. The actual number N of bandpass filters in the filter banks depends upon the frequency bands of interest, e.g. L, S, C, X, Ku and K bands. When varying the number N of bandpass filters in filter banks 58 and 128, the power splitters 40 and 112 and analog switches 80 and 150 must also be replaced by power splitters that have the corresponding number of outputs and analog switches that have the corresponding number of inputs.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. A radiometer for receiving and processing RF signals of the same frequency but with different polarizations, comprising:
    a plurality of RF signal paths, each RF signal path configured to receive and process RF signals from an external source, each of the RF signals having a particular polarization;
    an input bandpass filter in each RF signal path for filtering the received RF signal having the particular polarization and outputting a filtered received RF signal, wherein the input bandpass filter has a predetermined bandwidth and center frequency;
    a signal splitting device in each RF signal path for splitting the filtered received RF signal into a plurality of identical RF signals;
    a filter bank of bandpass filters in each RF signal path wherein each bandpass filter of the filter bank has the same bandwidth but different center frequencies and wherein each of the identical RF signals is filtered by a corresponding bandpass filter of the filter bank so as to provide a plurality of uniquely filtered RF signals having the particular polarization;
    an electronically controlled switch in each RF signal path which includes a plurality of RF signal inputs, a RF signal output and a control signal input for receiving a control signal that determines which of the RF signal inputs is coupled to the RF signal output, each RF signal input receiving a corresponding uniquely filtered RF signal provided by the filter bank, wherein the electronically controlled switch couples one of the uniquely filtered RF signals to the RF signal output upon receiving the control signal;
    programmable frequency conversion circuitry for converting the uniquely filtered RF signal outputted by the electronically controlled switch in each RF signal path into intermediate frequency representations having predetermined intermediate frequencies;
    signal conversion circuitry for converting the intermediate frequency representations into digital signals; and
    a signal processor to process the digital signals to extract desired information from the digital signals.

2. The radiometer according to claim 1 further comprising an amplifier in each RF signal path for amplifying the filtered received RF signal provided by the input bandpass filter.

3. The radiometer according to claim 1 further comprising a programmable control circuit for providing control signals for input into the electronically controlled switch in each RF signal path, each control signal defining which one of the uniquely filtered RF signals is to be outputted by the electronically controlled switch.

4. The radiometer according to claim 3 wherein the programmable frequency conversion circuitry comprises:
    a local oscillator for generating a local oscillator RF signal having a predetermined frequency;
    a mixer for mixing the local oscillator RF signal with the uniquely filtered RF signal outputted from the electronically controlled switch of one RF signal path to produce signals that include an intermediate frequency representation having one polarization; and
    another mixer for mixing the local oscillator RF signal with the uniquely filtered RF signal outputted by the electronically controlled switch of another one of the RF signal paths to produce signals that include an intermediate frequency representation having another polarization.

5. The radiometer according to claim 4 wherein the local oscillator comprises a voltage controlled oscillator which has input for receiving a voltage signal, wherein the magnitude of the voltage signal determines the frequency of the local oscillator RF signal.

6. The radiometer according to claim 5 wherein the programmable frequency conversion circuitry further comprises a programmable hardware element that has an input for receiving a digital signal that represents a desired voltage magnitude and an output for providing a voltage signal that has the desired voltage magnitude and wherein said voltage signal outputted by the programmable hardware element is coupled to the input of the voltage controlled oscillator.

7. The radiometer according to claim 6 further comprising a computer, wherein the computer comprises said signal processor, wherein the computer is in electronic signal communication with the programmable hardware element and programmed to generate the digital signal that is inputted into the programmable hardware element.

8. The radiometer according to claim 1 further comprising:
    a programmable control circuit in electronic signal communication with the electronically controlled switch in each RF signal path; and
    a computer in electronic signal communication with the programmable control circuit, wherein the computer is programmed to issue signals to the programmable control circuit to cause the programmable control circuit to issue control signals for input into the control signal inputs of the electronically controlled switches.

9. The radiometer according to claim 4 further comprising an amplifier for amplifying the local oscillator RF signal.

10. The radiometer according to claim 4 further comprising amplifiers for amplifying the signals outputted by each of the mixers.

11. The radiometer according to claim 4 further comprising additional bandpass filters, wherein each of the additional bandpass filters the signals outputted by the mixers so that only the intermediate frequency representations having the different polarizations are passed through the additional bandpass filters.

12. The radiometer according to claim 1 further including a memory medium for storing the desired information extracted from the digital signals.

13. The radiometer according claim 1 further including a dipole antenna coupled to each of the RF signal paths.

14. A radiometer, comprising:
a pair of RF front end channels for processing RF signals from an external source, each of the RF signals with different polarizations, wherein one RF front end channel processes horizontal polarization signals and the other RF front end channel processes vertical polarization signals, wherein each RF front end channel includes:
an input bandpass filter having an input for receiving the polarization signals, an output, a bandwidth and a center frequency, the input bandpass filter outputting a filtered polarization signal,
at least one amplifier for amplifying the filtered polarization signal to produce an amplified polarization signal,
a power splitter for splitting the amplified polarization signal into a plurality of identical polarization signals,
a filter bank comprising a plurality of bandpass filters, each bandpass filter of the filter bank having the same bandwidth and a different center frequency, each bandpass filter in the filter bank filtering a corresponding one of the plurality of identical polarization signals outputted by the power splitter and outputting a plurality of filtered polarization signals, and
an analog switch having a plurality of inputs, each input of the analog switch receiving a corresponding one of the plurality of filtered polarization signals, the analog switch including an output and a selection signal input for receiving a selection signal that configures the analog switch to route a particular one of the plurality of filtered polarization signals to the output of the analog switch;
a programmable control circuit for providing the selection signals;
a programmable frequency converter including one or more programmable hardware elements that cooperate to convert the filtered polarization signals outputted by the analog switches of the RF front end channels to intermediate frequency representations of the filtered polarization signals outputted by the analog switches, wherein the intermediate frequency representations have predetermined frequencies;
a computer for generating a first control signal for input into the programmable control circuit to effect generation of selection signals for input into the analog switches to enable each analog switch to output filtered polarization signals with desired center frequencies and for generating a second control signal for input into the programmable frequency converter to generate the intermediate frequency representations of the filtered polarization signals outputted by the analog switches, wherein the second control signal determines the frequencies of the intermediate frequency representations; and
a processing element for converting the intermediate frequency representations into digital signals.

15. The radiometer according to claim 14 wherein the computer is programmed to process the digital signals to extract particular information from said digital signals.

16. The radiometer according to claim 15 wherein the computer is programmed to process the digital signals with one or more signal processing algorithms.

17. The radiometer according to claim 14 further comprising a dipole antenna coupled to the input bandpass filter of each RF front end channel for receiving the horizontal polarization signals and vertical polarization signals.

18. The radiometer according to claim 14 wherein the at least one amplifier of each RF front end channel comprises a plurality of amplifiers arranged in cascade.

19. The radiometer according to claim 14 wherein one of the bandpass filters in the filter bank has a center frequency that is the same as the center frequency of the input bandpass filter.

20. The radiometer according to claim 14 wherein one of the bandpass filters in the filter bank has a center frequency that is less than the center frequency of the input bandpass filter.

21. The radiometer according to claim 14 wherein one of the bandpass filters in the filter bank has a center frequency that is greater than the center frequency of the input bandpass filter.

22. The radiometer according to claim 14 wherein the programmable frequency converter comprises a programmable local oscillator having an input for receiving the second control signal and outputting a local oscillator signal having a frequency determined by the second control signal.

23. The radiometer according to claim 22 wherein the programmable frequency converter further includes a pair of mixers, each mixer having an input for receiving the local oscillator signal and another input for receiving a filtered polarization signal outputted by an analog switch of a corresponding RF front end section, each mixer outputting a first signal having a frequency that is the sum of local oscillator signal and the frequency of the filtered polarization signal outputted by the corresponding analog switch and a second signal having an intermediate frequency that is the difference between the frequency of the local oscillator signal and the frequency of the filtered polarization signal outputted by the corresponding analog switch.

24. The radiometer according to claim 22 wherein the programmable frequency converter further includes a filter section including a pair of filters, each filter having a predetermined bandwidth and center frequency and filtering the signals outputted by a corresponding mixer, each filter passing only the signal having the intermediate frequency.

25. The radiometer according to claim 24 further including a pair of amplifiers, each amplifier being connected between one of the filters in the filter section and a corresponding mixer, the amplifier amplifying the signals outputted by the corresponding mixer.

26. The radiometer according to claim 22 wherein the programmable local oscillator comprises:
a programmable voltage source having an input for receiving the second control signal and outputting a tuning voltage having a magnitude that is determined by the second control signal; and
a voltage controlled oscillator having an tuning voltage input for receiving the tuning voltage and an output for providing a signal having a frequency determined by the tuning voltage.

27. The radiometer according to claim 22 wherein the programmable frequency converter further includes an amplifier to amplify the local oscillator signal.

28. The radiometer according to claim 23 wherein the programmable frequency converter further includes a power splitter for splitting the local oscillator signal into a plurality of identical local oscillator signals, wherein one of the identical local oscillator signals is inputted into one of the mixers and another one of the identical local oscillator signals is inputted into the other mixer.

29. The radiometer according to claim 14 wherein the processing element comprises an analog-to-digital signal converter for converting the signals outputted by the pair of filters of the filter section into digital signals.

30. The radiometer according to claim 14 wherein the programmable control circuit is programmed to generate duplicate selection signals for input into the processing element to enable the processing element to confirm which of the analog switches are active.

31. A method of processing RF signals from an external source, each of the RF signals of the same frequency but with different polarizations, comprising:
    providing a plurality of RF signal paths, each RF signal path configured to receive and process RF signals having a particular polarization;
    in each RF signal path, filtering the received RF signal having the particular polarization with an input bandpass filter having a predetermined bandwidth and center frequency so as to provide a filtered received RF signal;
    in each RF signal path, splitting the filtered received RF signal into a plurality of identical RF signals;
    in each RF signal path, inputting the plurality of identical RF signals into a filter bank of bandpass filters wherein each bandpass filter of the filter bank has the same bandwidth but different center frequencies and wherein each of the identical RF signals is filtered by a corresponding bandpass filter of the filter bank so as to provide a plurality of uniquely filtered RF signals having the particular polarization;
    in each RF signal path, selecting one of the plurality of uniquely filtered RF signals;
    converting the selected uniquely filtered RF signal from each RF signal path to an intermediate frequency representation having a predetermined intermediate frequency;
    converting the intermediate frequency representations into digital signals; and
    processing the digital signals to extract desired information from the digital signals.

32. The method according to claim 31 further comprising, in each RF signal path, amplifying the filtered received RF signal.

33. The method according to claim 31 further comprising providing electrical signals that define which of the uniquely filtered RF signals of each RF signal path are to be selected.

34. The method according to claim 31 wherein the step of converting the selected uniquely filtered RF signal from each RF signal path to an intermediate frequency representation comprises:
    generating a local oscillator RF signal having a predetermined frequency;
    mixing the local oscillator RF signal with the selected uniquely filtered RF signal from one of the RF signal paths to produce signals including an intermediate frequency representation having one polarization; and
    mixing the local oscillator RF signal with the selected uniquely filtered RF signal from another one of the RF signal paths to produce signals including an intermediate frequency representation having another polarization.

35. The method according to claim 34 further comprising providing an electrical signal that defines the predetermined frequency of the local oscillator RF signal.

36. The method according to claim 34 further comprising amplifying the local oscillator RF signal.

37. The method according to claim 34 further comprising:
    amplifying the signals produced by mixing the local oscillator RF signal with the selected uniquely filtered RF signal from said one of the RF signal paths; and
    amplifying the signals produced by mixing the local oscillator RF signal with the selected uniquely filtered RF signal from said another one of the RF signal paths.

38. The method according to claim 34 further comprising:
    filtering the signals produced by mixing the local oscillator RF signal with the selected uniquely filtered RF signal from said one of the RF signal paths with a bandpass filter so as to pass only the intermediate frequency representation having said one polarization; and
    filtering the signals produced by mixing the local oscillator RF signal with the selected uniquely filtered RF signal from said another one of the RF signal paths with a bandpass filter so as to pass only the intermediate frequency representation having said another polarization.

39. The method according to claim 34 wherein the step of converting the intermediate frequency representations into the digital signals comprises using an analog-to-digital converter to convert the intermediate frequency representations into the digital signals.

40. The method according to claim 34 wherein the step of processing the digital signals comprises processing the digital signals with one or more digital signal processing algorithms.

41. The method according to claim 31 further comprising storing the extracted desired information in a memory medium.

* * * * *